United States Patent
Endo et al.

[11] Patent Number: 5,563,237
[45] Date of Patent: Oct. 8, 1996

[54] CYANATE RESIN COMPOSITION AND COPPER-CLAD LAMINATE

[75] Inventors: Yasuhiro Endo; Yoichi Ueda; Toshiaki Hayashi; Mitsuhiro Shibata; Shinichiro Kitayama; Shuichi Kanagawa; Hisashi Watabu, all of Ibaraki, Japan

[73] Assignee: Sumitomo Chemical Company, Limited, Osaka, Japan

[21] Appl. No.: 200,884

[22] Filed: Feb. 23, 1994

[30] Foreign Application Priority Data

Feb. 23, 1993 [JP] Japan .................................. 5-033170
Mar. 10, 1993 [JP] Japan .................................. 5-049430

[51] Int. Cl.$^6$ .................................................. C08G 73/06
[52] U.S. Cl. ........................... 528/322; 528/407; 528/422; 528/423; 560/301; 428/457
[58] Field of Search ...................... 528/423, 422, 528/407, 322; 560/301; 428/457

[56] References Cited

U.S. PATENT DOCUMENTS 4,028,393  6/1977  Rattlaff .................................. 560/301

FOREIGN PATENT DOCUMENTS 548970  6/1993  European Pat. Off. .

*Primary Examiner*—Rachel Johnson
*Attorney, Agent, or Firm*—Sughrue, Mion, Zinn, Macpeak & Seas

[57] ABSTRACT

A cyanate resin composition suitable for a copper-clad laminate comprises components (A) and (B).

(A) a cyanate compound of the formula:

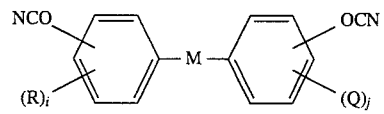

wherein R and Q each represents halogen, $C_{1-10}$ alkyl, $C_{5-7}$ cycloalkyl or $C_{6-20}$ hydrocarbon; i and j each represents 0–4 and M is (2):

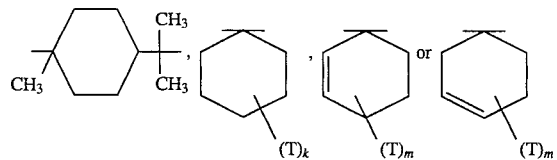

wherein T represents halogen, $C_{1-10}$ alkyl, $C_{5-7}$ cycloalkyl or $C_{6-20}$ hydrocarbon; k represents 0–10 and m represents 0–8, and (B) a hardener.

7 Claims, No Drawings

CYANATE RESIN COMPOSITION AND COPPER-CLAD LAMINATE

The present invention relates to a cyanate resin composition, a cyanate compound and a copper-clad laminate produced using the same.

Almost all substrates for printed circuit boards are made from adducts of bismaleimide compounds and amine compounds or a combination of bisphenol epoxy resins and dicyandiamide, which are thermosetting resin compositions for electric and electronic uses. The circuit boards are being directed to multiple layered ones. A requirement for resins to be used is that they have dielectric constant as low as possible in order mainly to improve signal propagation speed. One of conventional ways to this effect is addition of thermoplastic resins having low dielectric constant to thermosetting resins. However, this method has such disadvantage that heat resistance of the thermosetting resins is damaged. Demand for practically usable resins having low dielectric constant has not yet been sufficiently satisfied.

Under the circumstances, cyanate resins have been developed (e.g. German Patent No. 2533122 and International Patent No. 88/05443). Cyanates which are familiar at present include dicyanates of bisphenol A. Although these cyanates have relatively low dielectric constant, recent high advance of computer techniques requires materials having lower dielectric constant.

The inventors have made intensive research on matrix structures of cyanate compounds and found that use of a composition of compound having a specific structure satisfies the above requirement.

The present invention provides a cyanate resin composition from which a copper-clad laminate having dielectric constant low enough and practically acceptable heat resistance without damaging properties of conventional copper-clad laminates. The present invention also provides a copper-clad laminate produced using said cyanate resin composition.

That is, the present invention relates to the following cyanate resin compositions (1)-(2) cyanate compound and copper-clad laminates (4) using the same.

(1) A cyanate resin composition comprising (A) and (B) as essential components:

(A) a cyanate compound represented by the following formula (1):

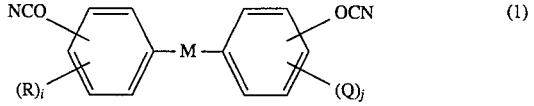

wherein R and Q each represents a halogen atom, an alkyl group of 1–10 carbon atoms, a cycloalkyl group of 5–7 carbon atoms or a hydrocarbon group of 6–20 carbon atoms which contains a cycloalkyl group of 5–7 carbon atoms, i and j each represents an integer of 0–4 with a proviso that, when i and j represent 2 or more, R and Q may be identical or different and M represents a group shown by the following formula (2):

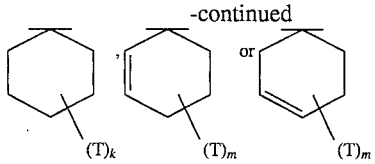

wherein T represents a halogen atom, an alkyl group of 1–10 carbon atoms, a cycloalkyl group of 5–7 carbon atoms or a hydrocarbon group of 6–20 carbon atoms which contains a cycloalkyl group of 5–7 carbon atoms, k represents an integer of 0–10 and m represents an integer of 0–8 with a proviso that, when k or m represents 2 or more, T may be identical or different and (B) a hardener.

(2) A cyanate resin composition comprising the above (A) and (B), and additionally (C) as essential components, said (C) being at least one of a brominated epoxy compound, a maleimide compound, a prepolymer of the brominated epoxy compound and a prepolymer of the maleimide compound.

(3) A cyanate compound represented by the following formula (3):

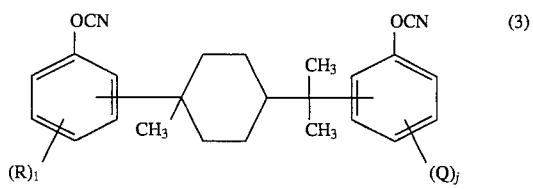

wherein R, Q, i and j are as defined in the formula (1).

(4) A copper-clad laminate prepared by heat molding a copper foil and a prepreg obtained by impregnating a substrate with a solution of the cyanate resin composition of the above (1) or (2) in an organic solvent.

The present invention is explained in detail below.

The cyanate compounds of the present invention are obtained by subjecting a bisphenol represented by the following formula (4):

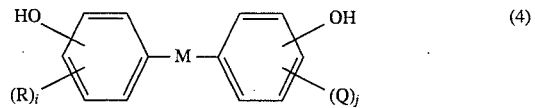

wherein R, Q, M, i and j are as defined for the formula (1), and a cyanogen halide such as cyanogen chloride or cyanogen bromide to dehydrohalogenation reaction in a suitable organic solvent in the presence of a base.

The bisphenol may be any of those which are obtained by known processes.

As the processes for producing the bisphenol, mention may be made of, for example, allowing limonene, dipentene, a cyclohexanone derivative or a cyclohexenone derivative to react with a phenol in the presence of an acid catalyst. The process is not limitative.

The phenol used above includes compounds having one phenolic hydroxyl group. Examples of the phenol are phenol; halogenated phenols such as 2-bromophenol and 2-chlorophenol; alkyl-substituted phenols such as o-cresol, m-cresol, p-cresol, 2-ethylphenol, 2-octylphenol, 2-nonylphenol, 2,6-xylenol, 2-t-butyl-5-methylphenol, 2-t-butyl-4-methylphenol, 2,4-di(t-butyl)phenol, 2-t-butylphenol, 2-sec-butylphenol and 2-n-butylphenol or position isomers thereof; and cycloalkyl-substituted phenols such as 2-cyclohexyphenol, 4-cyclohexylphenol and 2-cyclohexyl-5-methylphenol or position isomers thereof. These are not limitative. Among these phenols, preferred are phenol, o-cresol, m-cresol, p-cresol, 2,6-xylenol, 2-t-butyl-5-methylphenol, 2-t-butyl-4-methylphenol, 2,4-di(t-butyl)phenol, 2-cyclohexyl-5-methylphenol, 2-t-butylphenol, 2-sec-butylphenol, 2-n-butylphenol, 2-cyclohexylphenol and 4-cyclohexylphenol.

As examples of the cyclohexanone derivative used here, mention may be made of cyclohexanone; halogenated cyclohexanones such as 2-bromocyclohexanone and 2-chlorocyclohexanone; alkyl-substituted cyclohexanones such as 2-methyl cyclohexanone, 3-methylcyclohexanone, 4-methylcyclohexanone, 2-isopropylcyclohexanone, 3-isopropylcyclohexanone, 4-isopropylcyclohexanone, 2-n-butylcyclohexanone, 3-n-butylcyclohexanone, 4-n-butylcyclohexanone, 2-sec-butylcyclohexanone, 3-sec-butylcyclohexanone, 4-sec-butylcyclohexanone, 2-isobutylcyclohexanone, 3-isobutylcyclohexanone, 4-isobutylcyclohexanone, 2-t-butylcyclohexanone, 3-t-butylcyclohexanone, 4-t-butylcyclohexanone, 2,6-dimethylcyclohexanone, 2,4-diisopropylcyclohexanone, 3,5-diisopropylcyclohexanone, 2,4-di(t-butyl)-cyclohexanone, 3,5-di(t-butyl)cyclohexanone, 2-t-butyl-6-methylcyclohexanone, 3,3,5-trimethylcyclohexanone, 3,3,5,5-tetramethylcyclohexanone and 2,4,6-tri(t-butyl)cyclohexanone, or position isomers thereof; and cycloalkyl-substituted cyclohexanones such as 4-cyclopentylcyclohexanone, 4-cyclohexylcyclohexanone and 4-cyclohexyl-2-methylcyclohexanone, or position isomers thereof. These are not limitative. Among these cyclohexanone derivatives, preferred are cyclohexanone, 2-sec-butylcyclohexanone, 3-sec-butylcyclohexanone, 4-sec-butylcyclohexanone, 2-isobutylcyclohexanone, 3-isobutylcyclohexanone, 4-isobutylcyclohexanone, 2-t-butylcyclohexanone, 3-t-butylcyclohexanone, 4-t-butylcyclohexanone, 2,6-dimethylcyclohexanone, 2,4-diisopropylcyclohexanone, 3,5-diisopropylcyclohexanone, 2,4-di(t-butyl)cyclohexanone, 3,5-di(t-butyl)-cyclohexanone, 2-t-butyl-6-methylcyclohexanone, 3,3,5-trimethylcyclohexanone, 3,3,5,5-tetramethylcyclohexanone, 2,4,6-tri(t-butyl)cyclohexanone and 4-cyclohexylcyclohexanone.

As examples of the cyclohexenone derivatives, mention may be made of 2-cyclohexenone, 3-cyclohexenone; halogenated cyclohexenones such as 6-bromo-2-cyclohexenone and 6-chloro-2-cyclohexenone; alkyl-substituted cyclohexenones such as 2-methyl-2-cyclohexenone, 6-methyl-2-cyclohexenone, 4-isopropyl-2-cyclohexenone, 4-isobutyl-2-cyclohexenone, 4-t-butyl-2-cyclohexenone, isophorone, 2-methyl-3-cyclohexenone, 6-methyl-3-cyclohexenone, 4-isopropyl-3-cyclohexenone, 4-isobutyl-3-cyclohexenone, 4-t-butyl-3-cyclohexenone and 3,3,5-trimethyl-3-cyclohexenone, or position isomers thereof; and cycloalkyl-substituted cyclohexenones such as 4-cyclohexyl-2-cyclohexenone, 4-cyclohexyl-3-cyclohexenone, 4-cyclopentyl-2-cyclohexenone and 4-cyclohexyl-6-methyl-2-cyclohexenone, and position isomers thereof. These are not limitative. Among these cyclohexenone derivatives, preferred are 2-cyclohexenone, 4-isopropyl-2-cyclohexenone, 4-isobutyl-2-cyclohexenone, 4-t-butyl-2-cyclohexenone, 3,3,5-trimethyl-3-cyclohexenone, 2-methyl-3-cyclohexenone, 6-methyl-3-cyclohexenone, 4-isopropyl-3-cyclohexenone, 4-isobutyl-3-cyclohexenone, 4-t- butyl-3-cyclohexenone, isophorone, 4-cyclohexyl-2-cyclohexenone and 4-cyclohexyl-6-methyl-2-cyclohexenone.

As the hardener for the resin composition of the present invention, there may be used known ones. Examples are protonic acids such as hydrochloric acid and phosphoric acid; Lewis acids such as aluminum chloride, boron trifluoride and zinc chloride; aromatic hydroxy compounds such as phenol, pyrocatechol and dihydroxynaphthalene; organic metal salts such as zinc naphthenate, cobalt naphthenate, tin octylate and cobalt octylate; tertiary amines such as triethylamine, tributylamine, quinoline and isoquinoline; quaternary ammonium salts such as tetraethylammonium chloride and tetrabutylammonium bromide; imidazoles; sodium hydroxide, sodium methylate, triethylamine, tributylamine, diazabicyclo-(2,2,2)-octane, quinoline, isoquinoline, tetraethylammonium chloride and triphenylphosphine and mixtures thereof. Organic metal salts such as zinc naphthenate, cobalt octylate and tin octylate are preferred from the points of dissolvability with resins and reactivity.

The maleimide compounds used in the present invention are those which have two or more N-maleimide groups in the molecule and may be produced by any processes. Preferred are those which are represented by the following formula (5):

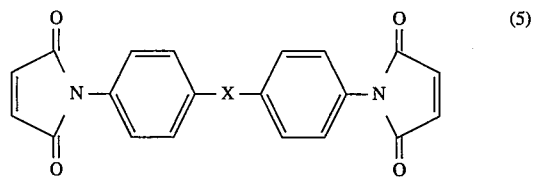

wherein X is a group represented by the following formula (6), (7), (8), (9), (10) or (11):

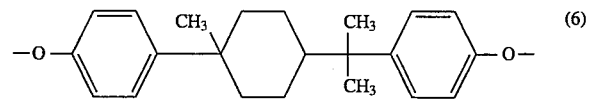

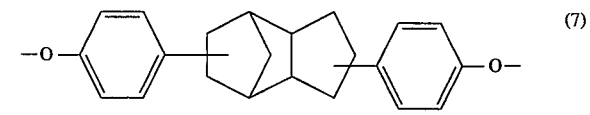

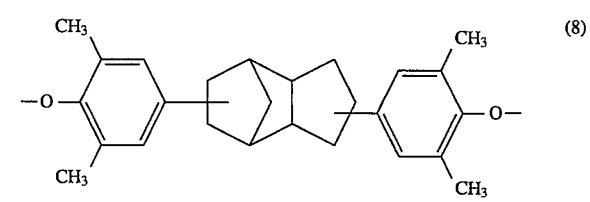

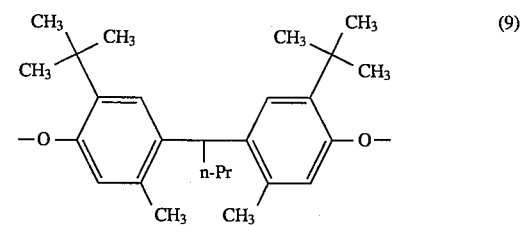

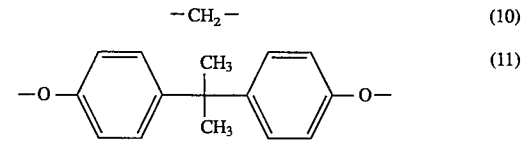

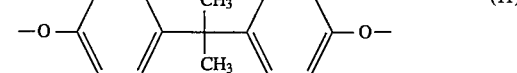

The cyanate compounds, brominated epoxy compounds and maleimide compounds used in the present invention may be used in the form of prepolymers. The prepolymers are produced by heating the compounds each alone or mixtures thereof in the presence of the hardener described above.

When flame retardancy is imparted to the copper-clad laminate, for example, a brominated epoxy compound is added to the composition so that bromine content is in the range of 5–25%. Considering easiness in availability and economical advantage, the brominated epoxy compounds usable include, for example, glycidyl ether of tetrabromobisphenol A and glycidyl ether of brominated phenol novolak, but these are not limitative.

Furthermore, as far as the present advantage is not damaged, there may be additionally used other thermosetting resins. Examples are epoxy resins such as diglycidyl ethers of bisphenol A or bisphenol F, and glycidyl ethers of phenol novolak or cresol novolak; addition polymers of bismaleimides with diamine compounds; alkenylaryl ether resins such as bisvinylbenzyl ethers of bisphenol A or tetrabromobisphenol A, and vinylbenzyl ether of 4,4'-diaminodiphenylmethane; alkynyl ether resins such as dipropargyl ethers of bisphenol A or tetrabromobisphenol A, and propargyl ether of diaminodiphenylmethane; and furthermore, phenolic resins, resol resins, allyl ether compounds, allyl-amine compounds, triallyl cyanurate, and vinyl group-containing polyolefin compounds. These are not limitative. Thermoplastic resins may also be added. Examples are polyphenylene ether, polystyrene, polyethylene, polybutadiene, polyimide and modified products thereof. These are not limitative. These resins may be used by incorporating into the cyanate resin compositions of the present invention, or by previously allowing them to react with the cyanate resins.

Known additives such as flame retardants, releasing agents, surface treating agents and fillers may be added to the compositions. Examples of the flame retardants are antimony trioxide and red phosphorus, those of the releasing agents are waxes and zinc stearate, those of the surface treating agents are silane coupling agents, and those of the fillers are silica, alumina, talc, clay and glass fibers.

The copper-clad laminate of the present invention is produced by known methods. That is, a substrate is impregnated with a resin varnish prepared by dissolving the thermosetting resin composition of the present invention or a prepolymer thereof in an organic solvent and the impregnated substrate is heat-treated to obtain a prepreg. Thereafter, the prepreg and a copper foil are laminated and heat-molded to make a copper-clad laminate.

The organic solvent used is selected from one or mixtures of acetone, methyl ethyl ketone, methyl isobutyl ketone, ethylene glycol monomethyl ether, propylene glycol monomethyl ether, toluene, xylene, N,N-dimethylformamide, dioxane, tetrahydrofuran and the like.

The substrate to be impregnated with resin varnish includes, for example, woven or nonwoven fabrics or mats comprising inorganic fibers or organic fibers such as glass fibers, polyester fibers and polyamide fibers and papers. These may be used each alone or in combination of two or more.

The heat-treating conditions for making the prepreg are selected depending on varieties of solvents, catalysts and additives used and amounts thereof, but usually at 100°–200° C. for 3–30 minutes.

The heat-molding conditions include, for example, hot press molding conducted at 150°–300° C., under a molding pressure of 10–100 kg/cm$^2$ for 20–300 minutes.

The following examples are illustrative of the invention. They should not be construed as limiting the invention in any manner.

PREPARATION EXAMPLE 1

This example concerns with preparation of 1,1-bis(4-hydroxy-3-methylphenyl)cyclohexane which is a starting material for the cyanate compound used in the present invention.

Cyclohexanone (147.3 g, 1.50 mol) was charged in a reactor equipped with a thermometer, a stirrer and a condenser and dissolved in o-cresol (648.6 g, 6.00 mol). Concentrated hydrochloric acid (600 g) was added thereto, followed by stirring at 60° C. for 10 hours. After completion of the reaction, toluene was added to the reaction mixture and the resulting precipitate containing a condensate of o-cresol and cyclohexanone was collected by filtration. The thus obtained precipitate was washed with water to remove hydrochloric acid to obtain the desired bis-o-cresolhexane (222 g). FD-MASS spectrum of the product showed that it had a molecular weight of 296 and a melting point of 190°–195° C.

PREPARATION EXAMPLE 2

This example concerns with preparation of 1,1-bis(4-cyanatophenyl)cyclohexane which is the cyanate compound used in the present invention.

1,1-Bis(4-hydroxyphenyl)cyclohexane (Antigen W manufactured by Sumitomo Chemical Co., Ltd., 200 g, 0.75 mol) as a starting material was dissolved in acetone (1,200 g) and the solution was cooled to −2° C. Cyanogen chloride (90.1 ml, 1.79 mol) was added to the solution and thereto was added dropwise triethylamine (158.6 g, 1.57 mol) over a period of 1 hour with taking care that the reaction temperature did not rise to higher than 0° C. After completion of the addition, the reaction mixture was kept at 5–8° C. for 2 hours and then diluted with chloroform (500 g). Salts were removed by filtration and the residue was washed with water. The solvent was evaporated under reduced pressure to obtain a red liquid product (207.1 g).

It was confirmed by infrared absorption spectrum of the resulting cyanate compound that absorption 3,200–3,600 cm$^{-1}$ of phenolic OH disappeared and it had an absorption of 2250 cm$^{-1}$ of nitrile of cyanate.

PREPARATION EXAMPLE 3

This example concerns with preparation of 1,1-bis(4-cyanato-3-methylphenyl)cyclohexane which is the cyanate compound used in the present invention.

The bisphenol obtained in Preparation Example 1 (200 g, 0.68 mol) was dissolved in acetone (600 g) and the solution was cooled to −5° C. Cyanogen chloride (81.6 ml, 1.62 mol) was added to the solution and thereto was added dropwise triethylamine (143.6 g, 1.42 mol) over a period of 1 hour with taking care that the reaction temperature did not rise to higher than 0° C. After completion of the addition, the reaction mixture was kept at 2–5° C. for 1 hour and then diluted with chloroform (500 g). Salts were removed by filtration and the residue was washed with water. The solvent was evaporated under reduced pressure to obtain a red resinous product (233.8 g).

It was confirmed by infrared absorption spectrum of the resulting cyanate compound that absorption 3,200–3,600 cm$^{-1}$ of phenolic OH disappeared and it had an absorption of 2250 cm$^{-1}$ of nitrile of cyanate.

PREPARATION EXAMPLE 4

This example concerns with preparation of N,N'-bis(4-aminophenoxyphenyl)menthanebismaleimide which is the maleimide compound used in the present invention.

Maleic anhydride (237.3 g) and chlorobenzene (2,373 g) were charged in a 5 liter four-necked flask and stirred under a nitrogen stream to dissolve maleic anhydride. YP-90 (reaction product of dipentene with phenol manufactured by Yasuhara Chemical Co.; hydroxyl equivalent: 162 g/eq) was allowed to react with p-chlorobenzene and the reaction product was reduced to obtain (4-aminophenoxyphenyl-)menthane. A solution prepared by dissolving the resulting (4-aminophenoxyphenyl)-menthane in dimethylacetamide (DMAc) (adjusted to 34.3% by weight in concentration) (1,625.1 g) was added dropwise to the above flask at 25°±5° C. over a period of 2 hours by a dropping funnel. The reaction was allowed to proceed at 35° C. for 2 hours to complete the formation reaction of amic acid.

Then, p-toluenesulfonic acid monohydrate (10.46 g) was added to the reaction product and dehydration-cyclization reaction was carried out at 100° C. for 1 hour and 110° C. for 1 hour with conducting azeotropic dehydration under reduced pressure and subsequently at 135° C. for 4 hours with gradually returning the pressure to normal pressure. The reaction was allowed to proceed with removing the produced water out of the system using Dean-Stark apparatus.

Then, chlorobenzene and successively DMAc were recovered in an amount of totally 89% under reduced pressure. Then, methylisobutyl ketone (MIBK) (2,200 g) was added to dissolve the residue. The resulting solution was cooled to 60° C., neutralized by adding thereto sodium bicarbonate in an amount weighed so as to adjust the pH of the aqueous layer to 5–7 and water (1,000 g) and subjected to washing and separation twice. Furthermore, this was subjected to washing and separation twice with 15% aqueous sodium chloride solution (1,000 g) at 60° C. and then subjected to azeotropic dehydration under reduced pressure, and the salts were removed by filtration. The filtrate was concentrated under reduced pressure and the product in molten state was taken out of the flask after the conditions in the system finally reached 150° C./5 Torr to obtain a light brown solid (724 g) (yield 98.7%). Gel permeation chromatography showed that it contained 95% of N,N'-bis(4-aminophenoxyphenyl)menthanebismaleimide and 5% of polymeric component.

Properties of the product are shown below.

mass spectrum M+= 666 melting point 96°–98° C.

1H-NMR spectrum

δ: 0.6–2.1 ppm (m, aliphatic), 2.8 ppm (m, methine), 6.8 ppm (s, imide group), 6.9–7.4 ppm (m, aromatic), Infrared absorption spectrum:
  1,238 $cm^{-1}$ (ether bond),
  1,712 $cm^{-1}$ (imide bond).

PREPARATION EXAMPLE 5

This example concerns with preparation of bis(4-aminophenoxyphenyl)dicyclopentanebismaleimide which is the polymaleimide compound used in the present invention.

The procedure of Preparation Example 4 was repeated except for using a solution (932.9 g) (concentration: 34.3%) prepared by dissolving in DMAc bis(4-aminophenoxyphenyl)dicyclopentane derived from DPP-600T (manufactured by Nippon Oil Co., Ltd.) in place of bis(4-aminophenoxyphenyl)-menthane derived from YP-90 (reaction product of dipentene and phenol; hydroxyl equivalent: 162 g/eq manufactured by Yasuhara Chemical Co., Ltd.) to obtain bis(4-aminophenoxyphenyl)dicyclopentane-bismaleimide (191.7 g, yield 97.4%) as a yellow crystal.

Properties of the product are shown below.

mass spectrum M+= 662, 1060

1H-NMR spectrum

δ: 1.0–2.5 ppm (m, aliphatic), 2.7 ppm (m, methine), 6.8 ppm (s, imide group), 6.6–7.3 ppm (m, aromatic), Infrared absorption spectrum:
  1,222 $cm^{-1}$ (ether bond),
  1,712 $cm^{-1}$ (imide bond).

PREPARATION EXAMPLE 6

This example concerns with preparation of N,N'-bis[4-(4-aminophenoxy)-3,5-dimethylphenyl]-dicyclopentanebismaleimide which is the polymaleimide compound used in the present invention.

Maleic anhydride (58.8 g) and acetone (137.2 g) were charged in a 1 liter four-necked flask and stirred under nitrogen stream to dissolve the maleic anhydride. With keeping the temperature at room temperature to 35° C., to the flask was added dropwise over 2 hours a solution prepared by dissolving dicyclopentane oligomer having 4-(4-aminophenoxy)-3,5-dimethylphenyl groups at both ends [prepared by reacting DXP-L-9-1 (reaction product of 2,6-xylenol and dicyclopentadiene; hydroxyl equivalent: 191 g/eq, manufactured by Nippon Oil Co., Ltd.) with p-chloronitrobenzene and then reducing the nitro group and containing 90% of bis[4-(4-aminophenoxy)-3,5-dimethylphenyl]-dicyclopentane measured by GPC and having an amine equivalent of 275 g/eq](150.0 g) in acetone (350 g). Stirring was continued for further 3 hours. Then, triethylamine (16.6 g) was added, followed by stirring for 30 minutes at room temperature. Then, nickel acetate (0.58 g) was added and the temperature Was raised to 40° C. Acetic anhydride (72.4 g) was added dropwise over a period of 1 hour and the temperature was kept until the reaction terminated. After termination of the reaction, the reaction mixture was discharged into pure water (1,000 g). The crystal was collected by filtration and washed with water and then with methanol, and dried by heating under reduced pressure to obtain the desired product of yellow crystal (189.4 g, yeild: 97.9%).

Properties of the product are shown below.

mass spectrum M+= 718

1H-NMR spectrum

δ1.0–2.5 ppm (m, aliphatic), 2.7 ppm (m, methine), 6.8 ppm (s, imide group), 6.5–7.3 ppm (m, aromatic), Infrared absorption spectrum: 1,220 $cm^{-}$(ether bond), 1,714 $cm^{-}$(imide bond).

PREPARATION EXAMPLE 7

This example concerns with preparation of N,N'-1,1-bis [4-(4-aminophenoxy)-5-t-butyl-2-methylphenyl]butanebismaleimide which is the polymaleimide compound used in the present invention.

Maleic anhydride (97.1 g) and acetone (226.5 g) were charged in a 2 liter four-necked flask and stirred under nitrogen stream to dissolve the maleic anhydride. With keeping the temperature at room temperature to 35° C., to the flask was added dropwise over 2 hours a solution prepared by dissolving 1,1-bis[4-(4-aminophenoxy)-5-t-butyl-2methylphenyl]butane (256.5 g) in acetone (598.5 g). Stirring was continued for further 3 hours. Then, triethylamine (27.3 g) was added, followed by stirring for 30 minutes at room temperature. Then, nickel acetate (0.95 g) was added and the temperature was raised to 40° C. Acetic anhydride (119.9 g) was added dropwise over a period of 1 hour and the reaction was continued at that temperature. After termination of the reaction, the reaction mixture was discharged into water (2.5 kg). The crystal was collected by filtration and washed with water and then with methanol, and dried by heating under reduced pressure to obtain the desired product of yellow crystal (306.1 g, yield: 93.9%). This can be recrystallized from a methylcellosolve/isopropyl alcohol mixed solvent.

Properties of the product are shown below.

melting point 127–130° C.

mass spectrum M+=724

1H-NMR spectrum

δ: 0.97 ppm (t, —CHCH$_2$CH$_2$CH$_3$), 1.34 ppm (s, t-butyl group), 1.92 ppm (q, —CHCH$_2$CH$_2$CH$_3$), 2.17 ppm (s, methyl group), 4.13 ppm (t, —CHCH$_2$CH$_2$CH$_3$), 6.65 ppm (s, imide group), 6.8–7.2 ppm (m, aromatic), Infrared absorption spectrum: 1,219 cm$^{-1}$ (ether bond), 1,712 cm$^{-1}$ (imide bond).

EXAMPLE 1

This example concerns with preparation of dicyanate of 4-[1-[4-[4-hydroxyphenyl]-4-methylcyclohexyl]-1-methylethyl]phenol of the present invention.

YP-90 (reaction product of dipentene and phenol manufactured by Yasuhara Chemical Co., Ltd.) (200 g, 0,645 mol), cyanogen chloride (84.4 ml, 1,677 mol) and chloroform (900 g) were charged in a 2 liter round separable four-necked flask equipped with a thermometer, a stirrer, a reflux condenser and a dropping funnel and dissolution was carried out at −5° C. Then, triethylamine (143.6 g, 1.419 mol) was added dropwise to the solution over a period of 1.5 hour. After completion of the addition, the temperature was raised to 5° C. and kept at that temperature for 3 hours. The reaction mixture was filtrated to remove salts, concentrated and dried under reduced pressure to obtain the desired product as a brown oil (210.3 g).

It was confirmed by infrared absorption spectrum of the thus obtained cyanate compound that absorption 3,200–3,600 cm$^{-1}$ of phenolic OH disappeared and there was absorption of 2,250 cm$^{-1}$ of nitrile of cyanate.

EXAMPLES 2–10

The cyanate compounds obtained in Preparation Examples 2–3 and Example 1 were mixed with hardener at the ratio as shown in Tables 1 and 2 (part by weight). In Examples 5–10, for imparting flame retardancy to the resin, glycidyl ether of tetrabromobisphenol A (Sumiepoxy ESB-400T having an epoxy equivalent of 403 g/eq manufactured by Sumitomo Chemical Co., Ltd.) was further added in such an amount that Br content was 10%. In Examples 2–7, the components were melt mixed at 170° C. and the resulting prepolymer was press molded at 200° C. for 2 hours to obtain a single resin cured product, and Tg and dielectric characteristics thereof were measured. In Examples 8–10, the components were once melt mixed at 140° C. to prepare a prepolymer and to the resulting prepolymer was further added zinc naphthenate as a catalyst, and the mixture was dissolved in methyl ethyl ketone to prepare a homogeneous resin varnish. A glass cloth (KS-1600S962LP manufactured by Kanebo Ltd.) was impregnated with the varnish and treated at 160° C. for 3–10 minutes by a hot-air dryer to obtain a prepreg. Five prepregs and a copper foil (subjected to TTAI treatment; 35μ thick, manufactured by Furukawa Circuit Foil Co., Ltd.) were stacked and hot press molded under a pressure of 50 kg/cm$^2$ at 200° C. for 120 minutes and after-cured at 200° C. for 120 minutes to obtain a copper-clad laminate of 1 mm thick. The properties are shown in Tables 1 and 2. Glass transition temperature (Tg) was obtained from the inflexion point of an expansion curve using a thermal analysis apparatus DT-30 manufactured by Shimadzu Seisakusho Ltd. Dielectric constant and dissipation factor at room temperature were measured using 4275A Multi-Frequency LCR meter manufactured by Yokogawa Hewlett Packard Co. and the value of dielectric constant was calculated from electric capacity. Peeling strength of the copper foil of the laminate, solder heat resistance and boiling water absorption were measured in accordance with JIS-C-6481. The properties in the following comparative examples and examples were measured also in the same manner as above.

COMPARATIVE EXAMPLES 1 and 2

The dicyanate compound of bisphenol A was mixed with the hardener or with the hardener and the brominated epoxy resin ESB-400T at the ratio as shown in Table 1. Resin cured products were obtained from the mixtures in the same manner as in Examples 1–6 and the properties thereof are shown in Table 1.

COMPARATIVE EXAMPLE 3

The dicyanate compound of bisphenol A and other components were used at the ratio as in Table 2 and using the mixture, copper-clad laminate was produced in the same manner as in Examples 8–10. Properties thereof are shown in Table 2.

EXAMPLES 11–28

Each of the cyanate compounds obtained in Preparation Examples 2–3 and Example 1 was once melt mixed with zinc naphthenate at 140° C. as a hardener to prepare prepolymers.

The resulting cyanate prepolymer was mixed with each of the polymaleimide compounds obtained in Preparation Examples 4–7 or N,N'-bis(4-aminophenyl)methanebismaeimide (manufactured by K. I. Kasei Co.) or N,N'-2,2-bis(4-aminophenoxyphenyl)propanebismaleimide (MB8000 manufactured by Mitsubishi Petrochemical Co., Ltd.) together with the hardener at the ratio as shown in Tables 3–5 and the resulting mixture was hot pressed at 200° C. for 2 hours under a pressure of 50 kg/cm$^2$ to prepare cured products. Properties of the products are shown in Tables 3–5. The ratio in these tables is shown by "part by weight".

EXAMPLES 29–49

Each of the cyanate compounds obtained in Preparation Examples 2–3 and Example 1 was once melt mixed with zinc naphthenate as a hardener at 140° C. to prepare prepolymers.

The resulting cyanate prepolymer was mixed with each of the polymaleimide compounds obtained in Preparation Examples 4–7 or N,N'-bis(4-aminophenyl)methanebismaleimide (manufactured by K. I. Kasei Co.) or N,N'-2,2-bis(4-aminophenoxyphenyl) propanebismaleimide (MB8000 manufactured by Mitsubishi Petrochemical Co., Ltd.)

together with the hardener at the ratio as shown in Tables 6–8 and the resulting mixture was dissolved in dimethylformamide to prepare a homogeneous resin varnish. Using the resin varnish, copper-clad laminates were produced in the same manner as in Examples 8–10.

In Examples 35, 42 and 49, for imparting flame retardancy, glycidyl ether of tetrabromobisphenol A (Sumiepoxy ESB-400T used hereabove) was added in such an amount that Br content in the resin composition was 5% by weight. Properties of the resulting copper-clad laminates are shown in Tables 6–8. In Tables 6–8, the amounts are shown by "part by weight" except that the amounts of zinc naphthenate and 2-ethyl-4-methylimidazole are shown by part by weight (phr) based on totally 100 parts by weight of the cyanate compound and the epoxy compound.

Dicyanate compound of bisphenol A was mixed with the hardener and the brominated epoxy resin ESB-400T at the ratio (part by weight) as shown in Tables 6–8 and the mixture was dissolved in methyl ethyl ketone to obtain a homogeneous resin varnish. Using the varnish, copper-clad laminates were produced in the same manner as in Examples 8–10 and properties thereof were measured as in Examples 8–10. The results are shown in Tables 6–8.

COMPARATIVE EXAMPLES 4–6

The dicyanate compound of bisphenol A was used at the same ratio as in Tables 3–5 and cured products of the mixtures were obtained in the same manner as in Examples 11–28. Properties thereof are shown in Tables 3–6.

COMPARATIVE EXAMPLES 7–9

The dicyanate compound of bisphenol A was used at the same ratio as in Tables 6–8 and using the mixtures, copper-clad laminates were produced in the same manner as in Examples 29–49. Properties thereof are shown in Tables 6–8.

TABLE 2-continued

| | Mixing ratio and properties of laminate | | | |
|---|---|---|---|---|
| | Example 8 | Example 9 | Example 10 | Comparative Example 3 |
| Cyanate compound of Preparation Example 3 | — | — | 80 | — |
| Bisphenol A cyanate | — | — | — | 80 |
| Sumiepoxy ESB-400T | 20 | 20 | 20 | 20 |
| Zinc naphthenate (phr) | 0.2 | 0.3 | 0.2 | 0.1 |
| Glass transition temperature (°C.) | 230 | 231 | 260 | 209 |
| Dielectric constant (1 MHz) | 3.90 | 3.88 | 3.90 | 4.54 |
| Dielectric loss tangent (1 MHz) | 0.006 | 0.008 | 0.006 | 0.008 |
| Copper foil peel strength (Kg/cm) | 1.50 | 1.60 | 1.42 | 1.58 |
| Boiling water absorption (% after 48 hr.) | 0.60 | 0.43 | 0.43 | 0.95 |
| Solder heat resistance (260° C. × 3 min.) | o | o | o | o |

Note:
mark o: no change in appearance when a laminate specimen was dipped for 3 min. in a solder bath (260° C.); the same in Tables 6, 7 and 8.

TABLE 1

| | Mixing ratio and properties of resin-cured product | | | | | | | |
|---|---|---|---|---|---|---|---|---|
| | Example 2 | Example 3 | Example 4 | Example 5 | Example 6 | Example 7 | Comparative Example 1 | Comparative Example 2 |
| Cyanate compound of Preparation Example 2 | 100 | — | — | 80 | — | — | — | — |
| Cyanate compound of Preparation Example 3 | — | 100 | — | — | 80 | — | — | — |
| Cyanate compound of Example 1 | — | — | 100 | — | — | 80 | — | — |
| Bisphenol A dicyanate | — | — | — | — | — | — | 100 | 80 |
| Sumiepoxy ESB-400T | — | — | — | 20 | 20 | 20 | — | 20 |
| Zinc naphthenate (phr) | 0.2 | 0.3 | 0.2 | 0.2 | 0.3 | 0.2 | 0.1 | 0.1 |
| Glass transition temperature (°C.) | 238 | 231 | 246 | 215 | 210 | 238 | 220 | 191 |
| Dielectric constant (1 MHz) | 2.90 | 2.88 | 2.90 | 2.98 | 2.96 | 2.97 | 3.23 | 3.32 |
| Dielectric loss tangent (1 MHz) | 0.004 | 0.005 | 0.005 | 0.005 | 0.006 | 0.006 | 0.008 | 0.005 |

TABLE 2

| | Mixing ratio and properties of laminate | | | |
|---|---|---|---|---|
| | Example 8 | Example 9 | Example 10 | Comparative Example 3 |
| Cyanate compound of Preparation Example 2 | 80 | — | — | — |
| Cyanate compound of Preparation Example 3 | — | 80 | — | — |

TABLE 3

| | Mixing ratio and properties of resin-cured product | | | | | | |
|---|---|---|---|---|---|---|---|
| | Example 11 | Example 12 | Example 13 | Example 14 | Example 15 | Example 16 | Comparative Example 4 |
| Cyanate compound of Preparation Example 2 | 90 | 90 | 90 | 90 | 90 | 90 | — |
| Bisphenol A dicyanate | — | — | — | — | — | — | 90 |
| Compound 1 | 10 | — | — | — | — | — | — |
| Compound 2 | — | 10 | — | — | — | — | — |
| Compound 3 | — | — | 10 | — | — | — | — |
| Compound 4 | — | — | — | 10 | — | — | — |
| Compound 5 | — | — | — | — | 10 | — | 10 |
| Compound 6 | — | — | — | — | — | 10 | — |
| Zinc naphthenate | 0.2 | 0.2 | 0.2 | 0.2 | 0.2 | 0.2 | 0.1 |
| 2-Ethyl-4-methylimidazole | 0.05 | 0.05 | 0.05 | 0.05 | 0.05 | 0.05 | 0.05 |
| Glass transition temperature (°C.) | 240 | 230 | 228 | 231 | 226 | 223 | 230 |
| Dielectric constant (1 MHz) | 2.92 | 2.90 | 2.91 | 2.91 | 2.95 | 2.94 | 3.15 |
| Dielectric loss tangent (1 MHz) | 0.005 | 0.004 | 0.004 | 0.004 | 0.005 | 0.005 | 0.006 |

(Notes)
Cyanate compound of Preparation Example 2: 1,1-Bis(4-cyanatophenyl)cyclohexane
Bisphenol A dicyanate: 2,2-Bis(4-cyanatophenyl)propane
Compound 1: N,N'-bis(4-aminophenoxyphenyl)methanebismaleimide (Preparation Example 5)
Compound 2: N,N'-bis(4-aminophenoxyphenyl)dicyclopentanebismaleimide (Preparation Example 6)
Compound 3: N,N'-bis[4-(4-aminophenoxy)-3,5-dimethylphenyl]dicyclopentanebismaleimide oligomer (Preparation Example 7)
Compound 4: N,N'-1,1-bis[4-(4-aminophenoxy)-5-t-butyl-2-methylphenyl]butanebismaleimide (Preparation Example 8)
Compound 5: N,N'-bis(4-aminophenyl)methanebismaleimide (K.I. Kasei Co.)
Compound 6: N,N'-2,2-bis(4-aminophenoxyphenyl)propanebismaleimide (Mitsubishi Petrochemical Co., Ltd.)

TABLE 4

| | Mixing ratio and properties of resin-cured product | | | | | | |
|---|---|---|---|---|---|---|---|
| | Example 17 | Example 18 | Example 19 | Example 20 | Example 21 | Example 22 | Comparative Example 5 |
| Cyanate compound of Preparation Example 3 | 90 | 90 | 90 | 90 | 90 | 90 | — |
| Bisphenol A dicyanate | — | — | — | — | — | — | 90 |
| Compound 1 | 10 | — | — | — | — | — | — |
| Compound 2 | — | 10 | — | — | — | — | — |
| Compound 3 | — | — | 10 | — | — | — | — |
| Compound 4 | — | — | — | 10 | — | — | — |
| Compound 5 | — | — | — | — | 10 | — | 10 |
| Compound 6 | — | — | — | — | — | 10 | — |
| Zinc naphthenate | 0.3 | 0.3 | 0.3 | 0.3 | 0.3 | 0.3 | 0.1 |
| 2-Ethyl-4-methylimidazole | 0.05 | 0.05 | 0.05 | 0.05 | 0.05 | 0.05 | 0.05 |
| Glass transition temperature (°C.) | 230 | 225 | 223 | 228 | 221 | 219 | 230 |
| Dielectric constant (1 MHz) | 2.89 | 2.90 | 2.91 | 2.90 | 2.93 | 2.93 | 3.15 |
| Dielectric loss tangent (1 MHz) | 0.005 | 0.005 | 0.005 | 0.005 | 0.006 | 0.005 | 0.006 |

(Notes)
Cyanate compound of Preparation Example 3: 1,1-Bis(4-cyanato-3-methylphenyl)cyclohexane
Bisphenol A dicyanate: 2,2-Bis(4-cyanatophenyl)propane
Compound 1: N,N'-bis(4-aminophenoxyphenyl)methanebismaleimide
Compound 2: N,N'-bis(4-aminophenoxyphenyl)dicyclopentanebismaleimide
Compound 3: N,N'-bis[4-(4-aminophenoxy)-3,5-dimethylphenyl]dicyclopentanebismaleimide oligomer
Compound 4: N,N'-1,1-bis[4-(4-aminophenoxy)-5-t-butyl-2-methylphenyl]butanebismaleimide
Compound 5: N,N'-bis(4-aminophenyl)methanebismaleimide
Compound 6: N,N'-2,2-bis(4-aminophenoxphenyl)propanebismaleimide

TABLE 5

| | Mixing ratio and properties of resin-cured product | | | | | | |
|---|---|---|---|---|---|---|---|
| | Example 23 | Example 24 | Example 25 | Example 26 | Example 27 | Example 28 | Comparative Example 6 |
| Cyanate compound of Example 1 | 90 | 90 | 90 | 90 | 90 | 90 | — |
| Bisphenol A dicyanate | — | — | — | — | — | — | 90 |
| Compound 1 | 10 | — | — | — | — | — | — |
| Compound 2 | — | 10 | — | — | — | — | — |
| Compound 3 | — | — | 10 | — | — | — | — |
| Compound 4 | — | — | — | 10 | — | — | — |
| Compound 5 | — | — | — | — | 10 | — | 10 |
| Compound 6 | — | — | — | — | — | 10 | — |
| Zinc naphthenate | 0.2 | 0.2 | 0.2 | 0.2 | 0.2 | 0.2 | 0.1 |
| 2-Ethyl-4-methylimidazole | 0.05 | 0.05 | 0.05 | 0.05 | 0.05 | 0.05 | 0.05 |
| Glass transition temperature (°C.) | 246 | 240 | 236 | 237 | 232 | 230 | 230 |
| Dielectric constant (1 MHz) | 2.91 | 2.90 | 2.91 | 2.90 | 2.93 | 2.93 | 3.15 |
| Dissipation factor (1 MHz) | 0.005 | 0.005 | 0.005 | 0.005 | 0.005 | 0.005 | 0.006 |

(Notes)
Cyanate compound of Example 1: Dicyanate of 4-[1-[4-[4-hydroxyphenyl]-4-methylcyclohexyl]-1-methylethyl]phenol
Bisphenol A dicyanate: 2,2-Bis(4-cyanatophenyl)propane
Compound 1: N,N'-bis(4-aminophenoxyphenyl)methanebismaleimide
Compound 2: N,N'-bis(4-aminophenoxyphenyl)dicyclopentanebismaleimide
Compound 3: N,N'-bis[4-(4-aminophenoxy)-3,5-dimethylphenyl]dicyclopentanebismaleimide oligomer
Compound 4: N,N'-1,1-bis[4-(4-aminophenoxy)-5-t-butyl-2-methylphenyl]butanebismaleimide
Compound 5: N,N'-bis(4-aminophenyl)methanebismaleimide
Compound 6: N,N'-2,2-bis(4-aminophenoxyphenyl)propanebismaleimide

TABLE 6

| | Mixing ratio and properties of laminate | | | | | | | |
|---|---|---|---|---|---|---|---|---|
| | Example 29 | Example 30 | Example 31 | Example 32 | Example 33 | Example 34 | Example 35 | Comparative Example 7 |
| Cyanate compound of Preparation Example 2 | 90 | 90 | 90 | 90 | 90 | 90 | 80 | — |
| Bisphenol A dicyanate | — | — | — | — | — | — | — | 90 |
| Compound 1 | 10 | — | — | — | — | — | — | — |
| Compound 2 | — | 10 | — | — | — | — | — | — |
| Compound 3 | — | — | 10 | — | — | — | — | — |
| Compound 4 | — | — | — | 10 | — | — | — | — |
| Compound 5 | — | — | — | — | 10 | — | 10 | — |
| Compound 6 | — | — | — | — | — | 10 | — | 10 |
| Sumiepoxy ESB-400T | — | — | — | — | — | — | 10 | — |
| Zinc naphthenate | 0.2 | 0.2 | 0.2 | 0.2 | 0.2 | 0.2 | 0.2 | 0.3 |
| 2-Ethyl-4-methylimidazole | 0.05 | 0.05 | 0.05 | 0.05 | 0.05 | 0.05 | 0.05 | 0.05 |
| Glass transition temperature (°C.) | 242 | 235 | 228 | 232 | 233 | 228 | 225 | 227 |
| Dielectric constant (1 MHz) | 3.81 | 3.79 | 3.80 | 3.81 | 3.89 | 3.90 | 3.92 | 4.20 |
| Dielectric loss tangent (1 MHz) | 0.005 | 0.004 | 0.004 | 0.004 | 0.005 | 0.005 | 0.006 | 0.004 |
| Boiling water absorption (%, 48 h) | 0.51 | 0.55 | 0.56 | 0.53 | 0.50 | 0.70 | 0.65 | 0.70 |
| Solder heat resistance (260° C. × 3 min.) | ○ | ○ | ○ | ○ | ○ | ○ | ○ | ○ |

(Notes)
Cyanate compound of Preparation Example 2: 1,1-Bis(4-cyanatophenyl)cyclohexane
Bisphenol A dicyanate: 2,2-Bis(4-cyanatophenyl)propane
Compound 1: N,N'-bis(4-aminophenoxyphenyl)methanebismaleimide
Compound 2: N,N'-bis(4-aminophenoxyphenyl)dicyclopentanebismaleimide
Compound 3: N,N'-bis[4-(4-aminophenoxy)-3,5-dimethylphenyl]dicyclopentanebismaleimide oligomer
Compound 4: N,N'-1,1-bis[4-(4-aminophenoxy)-5-t-butyl-2-methylphenyl]butanebismaleimide
Compound 5: N,N'-bis(4-aminophenyl)methanebismaleimide
Compound 6: N,N'-2,2-bis(4-aminophenoxyphenyl)propanebismaleimide

TABLE 7

| | Mixing ratio and properties of laminate | | | | | | | |
|---|---|---|---|---|---|---|---|---|
| | Example 36 | Example 37 | Example 38 | Example 39 | Example 40 | Example 41 | Example 42 | Comparative Example 8 |
| Cyanate compound of Preparation Example 3 | 90 | 90 | 90 | 90 | 90 | 90 | 80 | — |
| Bisphenol A dicyanate | — | — | — | — | — | — | — | 90 |
| Compound 1 | 10 | — | — | — | — | — | — | — |
| Compound 2 | — | 10 | — | — | — | — | — | — |
| Compound 3 | — | — | 10 | — | — | — | — | — |
| Compound 4 | — | — | — | 10 | — | — | — | — |
| Compound 5 | — | — | — | — | 10 | — | 10 | — |
| Compound 6 | — | — | — | — | — | 10 | — | 10 |
| Sumiepoxy ESB-400T | | | | | | | 10 | — |
| Zinc naphthenate | 0.3 | 0.3 | 0.3 | 0.3 | 0.3 | 0.3 | 0.3 | 0.3 |
| 2-Ethyl-4-methylimidazole | 0.05 | 0.05 | 0.05 | 0.05 | 0.05 | 0.05 | 0.05 | 0.05 |
| Glass transition temperature (°C.) | 231 | 230 | 228 | 225 | 228 | 221 | 220 | 227 |
| Dielectric constant (1 MHz) | 3.78 | 3.75 | 3.81 | 3.80 | 3.85 | 3.87 | 3.89 | 4.20 |
| Dielectric loss tangent (1 MHz) | 0.005 | 0.005 | 0.005 | 0.005 | 0.006 | 0.005 | 0.006 | 0.004 |
| Boiling water absorption (%, 48 h) | 0.40 | 0.45 | 0.41 | 0.43 | 0.44 | 0.56 | 0.55 | 0.70 |
| Solder heat resistance (260° C. × 3 min.) | ○ | ○ | ○ | ○ | ○ | ○ | ○ | ○ |

(Notes)
Cyanate compound of Preparation Example 3: 1,1-Bis(4-cyanato-3-methylphenyl)cyclohexane
Bisphenol A dicyanate: 2,2-Bis(4-cyanatophenyl)propane
Compound 1: N,N'-bis(4-aminophenoxyphenyl)methanebismaleimide
Compound 2: N,N'-bis(4-aminophenoxyphenyl)dicyclopentanebismaleimide
Compound 3: N,N'-bis[4-(4-aminophenoxy)-3,5-dimethylphenyl]dicyclopentanebismaleimide oligomer
Compound 4: N,N'-1,1-bis[4-(4-aminophenoxy)-5-t-butyl-2-methylphenyl]butanebismaleimide
Compound 5: N,N'-bis(4-aminophenyl)methanebismaleimide
Compound 6: N,N'-2,2-bis(4-aminophenoxyphenyl)propanebismaleimide

TABLE 8

| | Mixing ratio and properties of laminate | | | | | | | |
|---|---|---|---|---|---|---|---|---|
| | Example 43 | Example 44 | Example 45 | Example 46 | Example 47 | Example 48 | Example 49 | Comparative Example 9 |
| Cyanate compound of Example 1 | 90 | 90 | 90 | 90 | 90 | 90 | 80 | — |
| Bisphenol A dicyanate | — | — | — | — | — | — | — | 90 |
| Compound 1 | 10 | — | — | — | — | — | — | — |
| Compound 2 | — | 10 | — | — | — | — | — | — |
| Compound 3 | — | — | 10 | — | — | — | — | — |
| Compound 4 | — | — | — | 10 | — | — | — | — |
| Compound 5 | — | — | — | — | 10 | — | 10 | — |
| Compound 6 | — | — | — | — | — | 10 | — | 10 |
| Sumiepoxy ESB-400T | | | | | | | 10 | — |
| Zinc naphthenate | 0.2 | 0.2 | 0.2 | 0.2 | 0.2 | 0.2 | 0.2 | 0.3 |
| 2-Ethyl-4-methylimidazole | 0.05 | 0.05 | 0.05 | 0.05 | 0.05 | 0.05 | 0.05 | 0.05 |
| Glass transition temperature (°C.) | 258 | 251 | 246 | 249 | 245 | 243 | 239 | 227 |
| Dielectric constant (1 MHz) | 3.62 | 3.82 | 3.80 | 3.83 | 3.91 | 3.92 | 3.93 | 4.20 |
| Dielectric loss tangent (1 MHz) | 0.005 | 0.005 | 0.005 | 0.005 | 0.005 | 0.006 | 0.006 | 0.004 |
| Boiling water absorption (%, 48 h) | 0.39 | 0.43 | 0.41 | 0.43 | 0.45 | 0.53 | 0.58 | 0.70 |
| Solder heat resistance (260° C. × 3 min.) | ○ | ○ | ○ | ○ | ○ | ○ | ○ | ○ |

(Notes)
Cyanate compound of Example 1: Dicyanate of 4-[1-[4-hydroxyphenyl]-4-methylcyclohexyl]-1-methylethyl]phenol
Bisphenol A dicyanate: 2,2-Bis(4-cyanatophenyl)propane
Compound 1: N,N'-bis(4-aminophenoxyphenyl)methanebismaleimide
Compound 2: N,N'-bis(4-aminophenoxyphenyl)dicyclopentanebismaleimide
Compound 3: N,N'-bis[4-(4-aminophenoxy)-3,5-dimethylphenyl]dicyclopentanebismaleimide oligomer
Compound 4: N,N'-1,1-bis[4-(4-aminophenoxy)-5-t-butyl-2-methylphenyl]butanabismaleimide
Compound 5: N,N'-bis(4-aminophenyl)methanebismaleimide
Compound 6: N,N'-2,2-bis(4-aminophenoxyphenyl)propanebismaleimide As explained above, copper-clad laminates obtained using the cyanate resin composition of the present invention are lower in dielectric constant than conventional laminates and furthermore superior in water resistance and heat resistance. Therefore, the copper-clad laminates are suitable for multilayer printed circuit boards for high speed operation processing.

What is claimed is:

1. A cyanate resin composition comprising as essential components:

(A) a cyanate compound represented by the following formula (1):

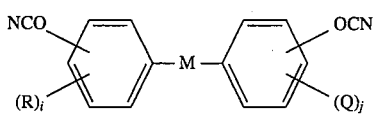 (1)

wherein R and Q each represents a halogen atom, an alkyl group of 1–10 carbon atoms, a cycloalkyl group of 5–7 carbon atoms or a hydrocarbon group of 6–20 carbon atoms which contains a cycloalkyl group of 5–7 carbon atoms, i and j each represents an integer of 0–4 with a proviso that, when i and j represent 2 or more, R and Q may be identical or different, and M represents a group shown by the following formula (2.a), (2.b) or (2.c):

 (2.a)

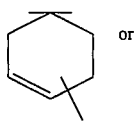 (2.b)

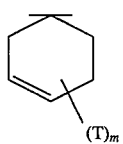 (2.c)

wherein T represents a halogen atom, an alkyl group of 1–10 carbon atoms, a cycloalkyl group of 5–7 carbon atoms or a hydrocarbon group of 6–20 carbon atoms which contains a cycloalkyl group of 5–7 carbon atoms, and m represents an integer of 0–8 with a proviso that, when m represents 2 or more, T may be identical or different, or a prepolymer of the cyanate compound, and (B) a hardener.

2. A cyanate resin composition according to claim 1, which comprises as essential components the above (A) and (B) and additionally (C) at least one selected from a brominated epoxy compound, a prepolymer thereof, a maleimide compound or a prepolymer thereof.

3. A cyanate compound represented by the following formula (3):

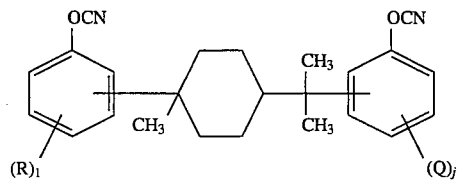

wherein R and Q each represents a halogen atom, an alkyl group of 1–10 carbon atoms, a cycloalkyl group of 5–7 carbon atoms or a hydrocarbon group of 6–20 carbon atoms which contains a cycloalkyl group of 5–7 carbon atoms, and i and j each represents an integer of 0–4 with a proviso that, when i and j represent 2 or more, R and Q may be identical or different.

4. A cyanate resin composition according to claim 2, wherein the maleimide compound is represented by the following formula (5):

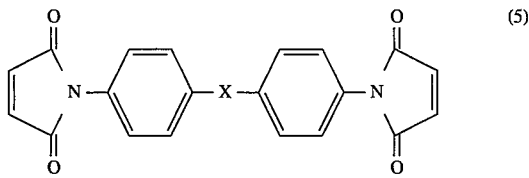 (5)

wherein X represents a group having the following formula (6), (7), (8), (9), (10) or (11):

 (6)

 (7)

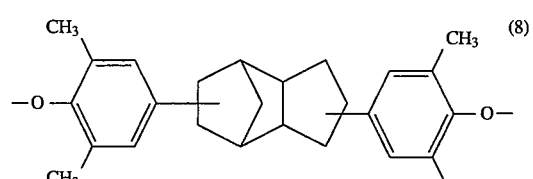 (8)

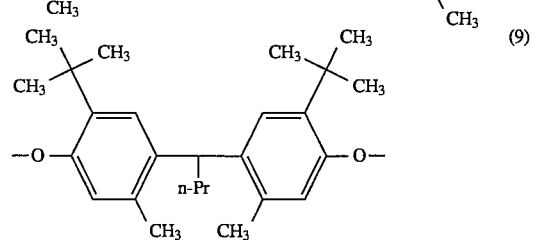 (9)

$-CH_2-$ (10)

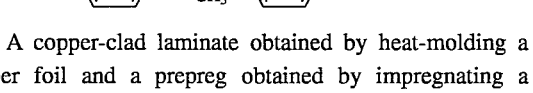 (11)

5. A copper-clad laminate obtained by heat-molding a copper foil and a prepreg obtained by impregnating a substrate with a solution prepared by dissolving the cyanate resin composition of anyone of claims 1, 2 or 4 in an organic solvent.

6. A copper-clad laminate obtained by heat-molding a copper foil and a prepreg obtained by impregnating a substrate with a solution prepared by dissolving a cyanate resin composition comprising the cyanate compound of claim 3 in an organic solvent.

7. A cyanate resin composition comprising as essential components:

(A) a cyanate compound represented by the following formula (12):

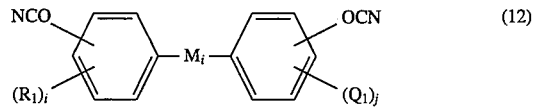 (12)

wherein $R_1$ and $Q_1$ each represents a cycloalkyl group of 5–7 carbon atoms or a hydrocarbon group of 6–20 carbon atoms which contains a cycloalkyl group of 5–7 carbon atoms, i and j each represents an integer of 0–4 wherein at least one of i or j is non-zero, with the proviso that, when i and j represent 2 or more, $R_1$ and Q may be identical or different, and M represents a group shown by the following formula (2.d)

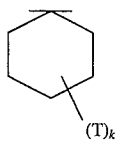

(2.d)

wherein T represents a halogen atom, an alkyl group of 1–10 carbon atoms, cycloalkyl group of 5–7 carbon atoms or a hydrocarbon group of 6–20 carbon atoms which contains a cycloalkyl group of 5–7 carbon atoms, k represents an integer of 0–10 with a proviso that, when k represents 2 or more, T may be identical or different.

* * * * *